United States Patent
Neidengard

(10) Patent No.: US 7,405,631 B2
(45) Date of Patent: Jul. 29, 2008

(54) OSCILLATING DIVIDER TOPOLOGY

(75) Inventor: Mark L. Neidengard, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 386 days.

(21) Appl. No.: 10/880,693

(22) Filed: Jun. 30, 2004

(65) Prior Publication Data

US 2006/0001495 A1    Jan. 5, 2006

(51) Int. Cl.
*H03K 3/03* (2006.01)
(52) U.S. Cl. ......................... 331/57; 327/114
(58) Field of Classification Search .............. 331/57, 331/179; 327/113, 117
See application file for complete search history.

(56) References Cited

U.S. PATENT DOCUMENTS

| | | | | |
|---|---|---|---|---|
| 6,204,694 | B1 * | 3/2001 | Sunter et al. | 326/93 |
| 6,252,472 | B1 * | 6/2001 | Klaeyle | 332/117 |
| 6,690,241 | B2 * | 2/2004 | Ooishi et al. | 331/57 |
| 6,949,954 | B2 * | 9/2005 | Nystrom et al. | 326/93 |
| 2003/0014620 | A1 * | 1/2003 | Hanjani | 713/1 |

* cited by examiner

*Primary Examiner*—Dinh T. Le
(74) *Attorney, Agent, or Firm*—Trop, Pruner & Hu, P.C.

(57) ABSTRACT

An oscillator includes a first circuit that asynchronously generates an oscillating signal in response to a second circuit of the oscillator acknowledging each cycle of the oscillating signal.

17 Claims, 15 Drawing Sheets

OSCILLATING DIVIDER TOPOLOGY

BACKGROUND

The invention generally relates to an oscillating divider topology.

A conventional integrated circuit may have many different clock domains that span across the circuit. Because an ever-increasing number of devices are fabricated onto the integrated circuit, the number of clock domains on the integrated circuit typically increase from one generation to the next.

Challenges may arise in accommodating a large number of clock domains on a single integrated circuit in that it may take a significant number of clock cycles for a signal to propagate from one side of the integrated circuit to another. Asynchronous circuits are not synchronized to a clock signal, and therefore, asynchronous circuits provide a solution to the above-described problem with synchronized circuits. Instead of being synchronized to a clock signal, an asynchronous circuit is self-timed, which means the circuit uses a handshake protocol (and thus, not a clock signal) for purposes of communicating signals. One such protocol, called a quasi delay insensitive (QDI) protocol, adheres to the strictest asynchronous standard.

Pursuant to a QDI cycle, a transmitter may communicate data to a receiver in the following manner. Before driving its output terminals with data to be communicated to the receiver, the transmitter waits for the receiver to assert an acknowledge signal indicating that the receiver is able to receive new data from the transmitter. Thus, upon assertion of the acknowledge signal, the transmitter drives its output signals to indicate a particular data value. To indicate receipt of the data, the receiver de-asserts the acknowledge signal. After the de-assertion of the acknowledge signal, the transmitter removes the data from its output terminals. For example, the transmitter may drive each of its output signals to the same predetermined logic level to effectively tri-state the output terminals. In acknowledgement of this action by the transmitter, the receiver then asserts the acknowledge signal to begin another QDI cycle.

Operating frequencies of integrated circuits continue to increase from one generation of integrated circuits to the next, and certain circuits may be more sensitive to increased frequencies than others. For example, a conventional integrated circuit may include various synchronous-based frequency dividers and oscillators, circuits whose performances may be lacking as operating frequencies increase.

Thus, there is a continuing need for better ways for a technique and/or system to address one or more of the problems that are set forth above as well as address one or more problems that are not set forth above.

DETAILED DESCRIPTION

An embodiment of an oscillator in accordance with the invention has a minimalist topology, a characteristic that enhances the performance and reduces the size of the oscillator. In some embodiments of the invention, the oscillator is an asynchronous oscillator, such as a quasi delay insensitive (QDI) oscillator 10 that is depicted in FIG. 2.

Figure 2:
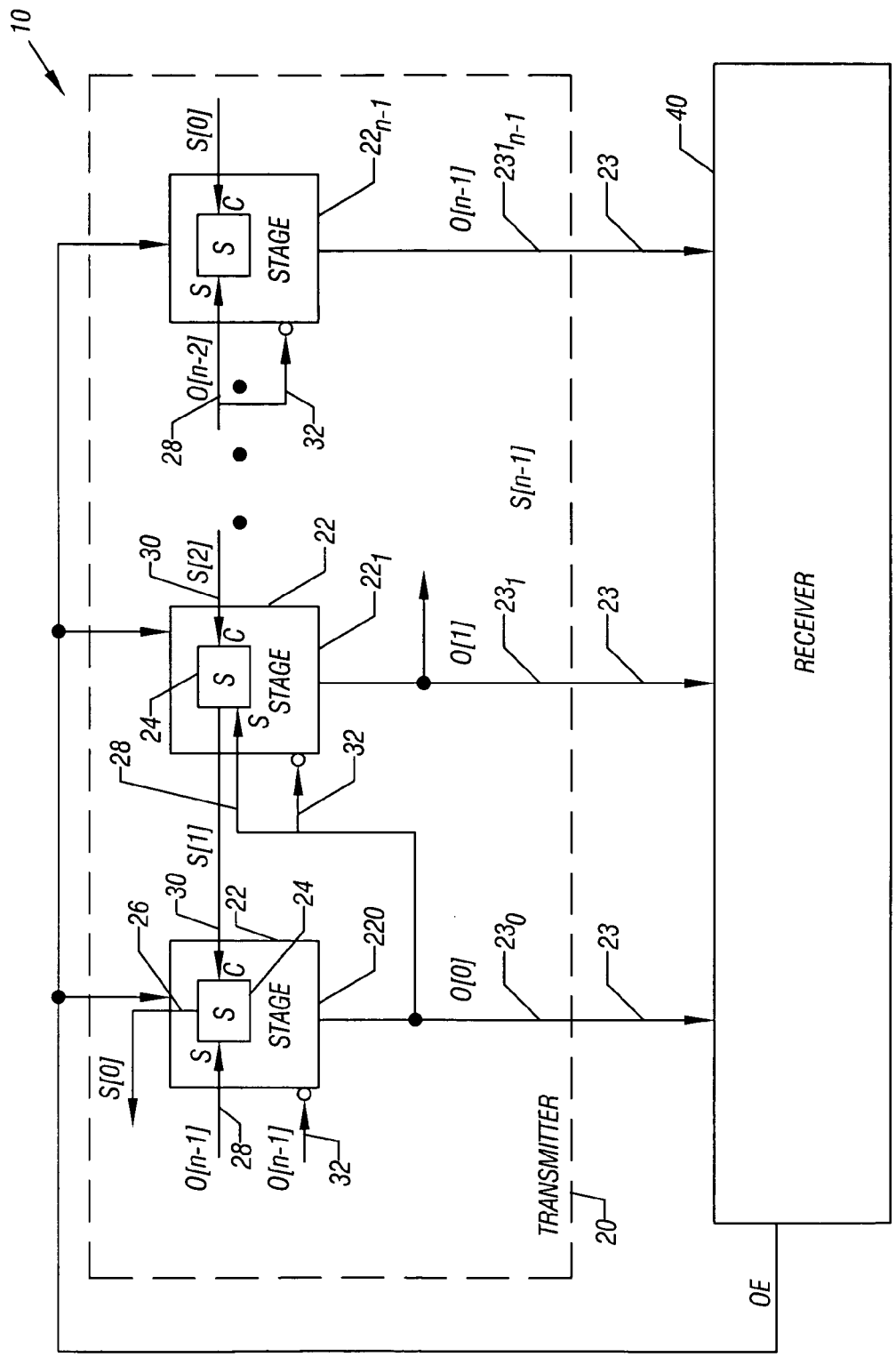
FIGS. 2 and 4 are a block diagrams depicting asynchronous oscillators according to different embodiments of the invention.

Referring to FIG. 2, the oscillator 10 includes n oscillator stages 22 (oscillator stages $22_0$, $22_1$ ... $22_{n-1}$, depicted as examples), each of which provides an output signal to a corresponding output line 23 (output lines $23_0$, $23_1$ ... $23_{n-1}$, depicted as examples). For example, the stage $22_0$ provides an output signal called O[0] to the output line 230, the stage $22_1$ provides an output signal called O[1] to the output line $21_1$, the stage $22_{n-1}$ furnishes a signal called O[n-1] to the output line $23_{n-1}$, etc.

During each oscillation cycle, the O[ ] output signals of the transmitter 20 collectively indicate a particular output value. In some embodiments of the invention, the transmitter 20 uses 1 by n encoding so that for each oscillation cycle, one of the output lines 23 is asserted (driven high, for example) and the remaining output lines 23 are de-asserted (driven low, for example) to indicate a particular output value. Thus, the transmitter 20 selectively asserts one of the output lines 23 during each oscillation cycle to indicate a particular output value. It is noted that in other embodiments of the invention, other types of encoding (2 by n encoding in which two output lines indicate a particular output value, for example) may be used. However, for purposes of simplifying the description of the oscillator 10 herein, it is assumed that the transmitter 20 uses 1 by encoding. Furthermore, for purposes of clarifying the description herein, it is assumed that the transmitter 20 asserts the O[ ] output signals one at a time according to the following circular output sequence: O[0], O[1], O[2] ... O[n-1], O[n], O[0], O[1], O[2], etc.

Figure 14:
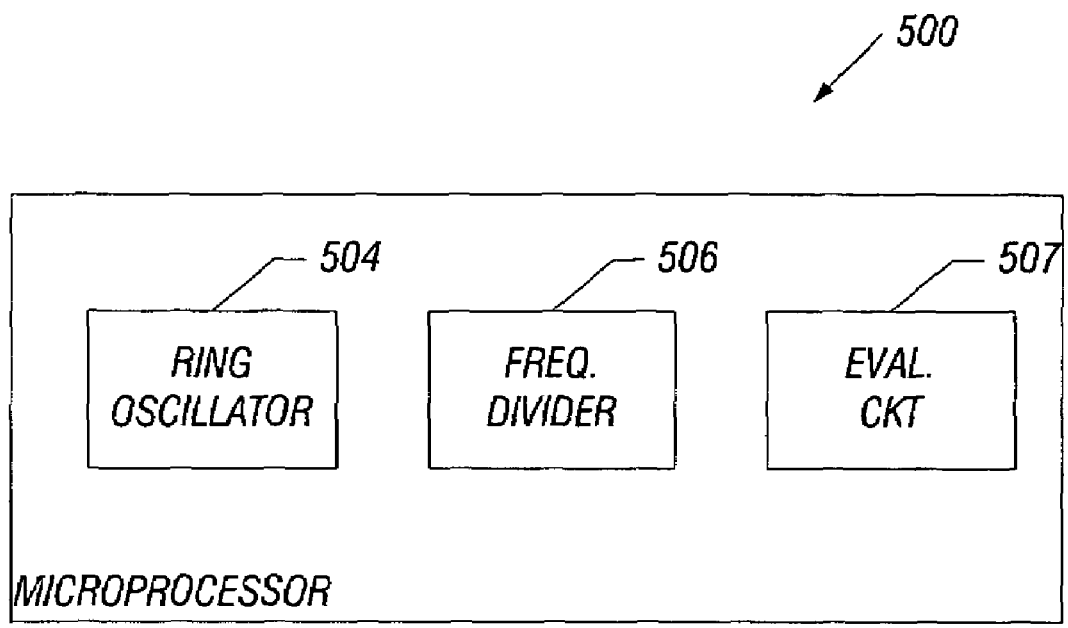
FIG. 14 is a schematic diagram of a microprocessor according to an embodiment of the invention.
Figure 15:
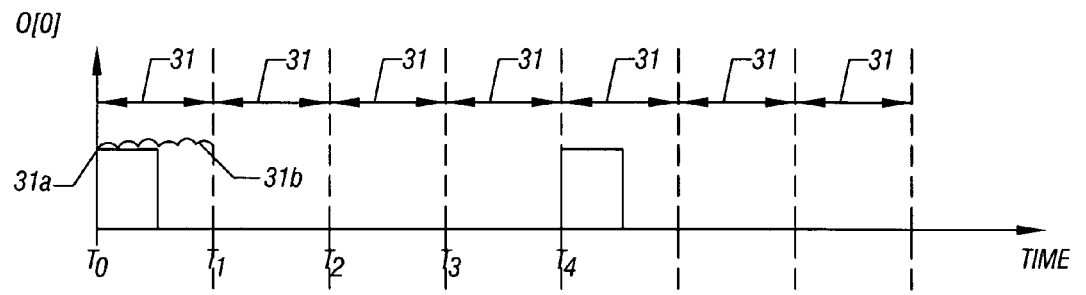
FIGS. 15, 16, 17 and 18 are waveforms of signals provided by the oscillator of FIG. 1 according to an embodiment of the invention.
Figure 16:
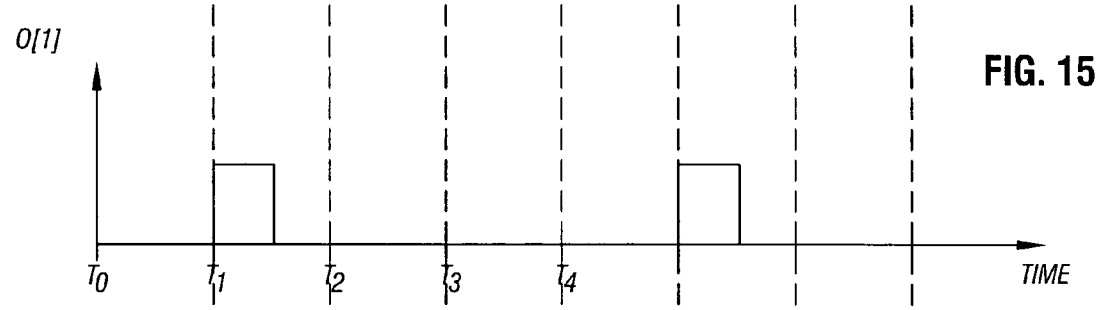
Figure 17:
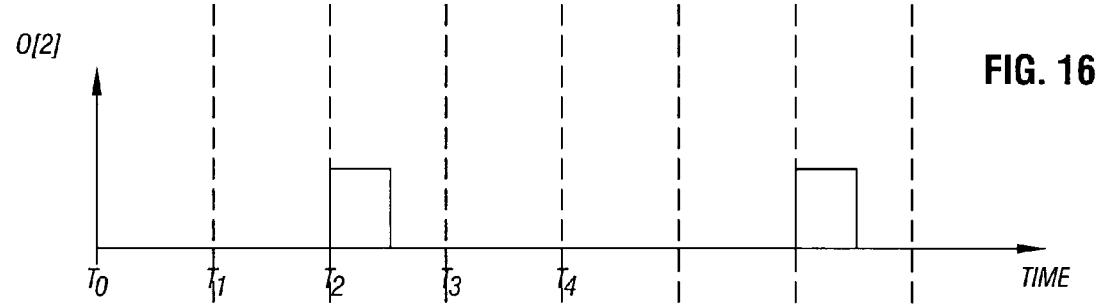
Figure 18:
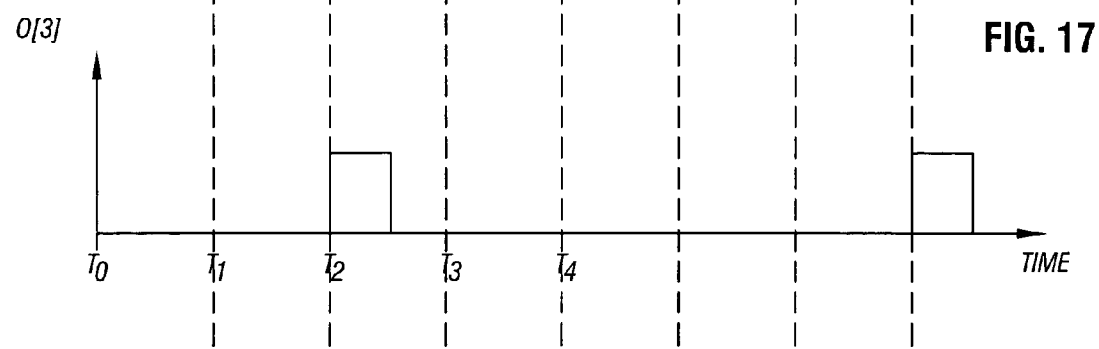

FIGS. 14, 15, 16, and 17 depict a more specific example for the scenario where n is 3, i.e., the transmitter 20 has four oscillator stages 22 that furnish the following four O[ ] output signals: O[0] (FIG. 15); O[1] (FIG. 16); O[2] (FIG. 17); and O[3] (FIG. 18). For each output value that is furnished by the transmitter 20, the transmitter 20 cycles through an oscillation cycle 31. As depicted in FIG. 14, each oscillation cycle has two parts: a first portion 31a in which the transmitter 20 selectively drives its output terminals 23 to indicate a particular output value and a second portion 31b in which the transmitter 20 removes the output value from the output terminals 23. For the scenario depicted in FIGS. 15, 16, 17 and 18, during an oscillation cycle 31 that occurs from time $T_0$ to $T_1$, the transmitter 20 asserts the O[0] signal and de-asserts the O[1], O[2] and O[3] signals during the portion 31a of the cycle 31. During the latter portion 31b of this cycle 31, the transmitter 20 de-asserts all of the O[0], O[1], O[2] and O[3] signals.

The de-assertion of all of the O[0], O[1], O[2] and O[3] signals occurs during the portion 31b of each of the oscillation cycles 31. Which O[ ] signal is asserted during the first portion 31a of the oscillation cycle 31 depends on the sequence. For example, during the oscillation cycle 31 occurring from time $T_1$ to time $T_2$, the transmitter 20 asserts the O[1] signal, and then the transmitter 20 de-asserts the O[0], O[2] and O[3] signals during the portion 31a of the cycle 31. During the oscillation cycle 31 occurring from time $T_2$ to time $T_3$, the transmitter 20 asserts the O[2] signal, and then the transmitter de-asserts the O[0], O[1] and O[3] signals during the portion 31a of the cycle 31. During the oscillation cycle 31 occurring from time $T_3$ to time $T_4$, the transmitter 20 asserts the O[3] signal, and then the transmitter 20 de-asserts the O[0], O[1] and O[2] signals during the portion 31a of the cycle 31. At time $T_4$, the above-described output sequence repeats, with the transmitter 20 asserting the O[0] signal and de-asserting the O[1], O[2] and O[3] signals during the portion 31a.

In some embodiments of the invention, the receiver 40 or another circuit may selectively combine the O[ ] signals to produce, for example, clock signals that have frequencies that are fractions of the frequencies that control the oscillation, as further described below.

Figure 1:
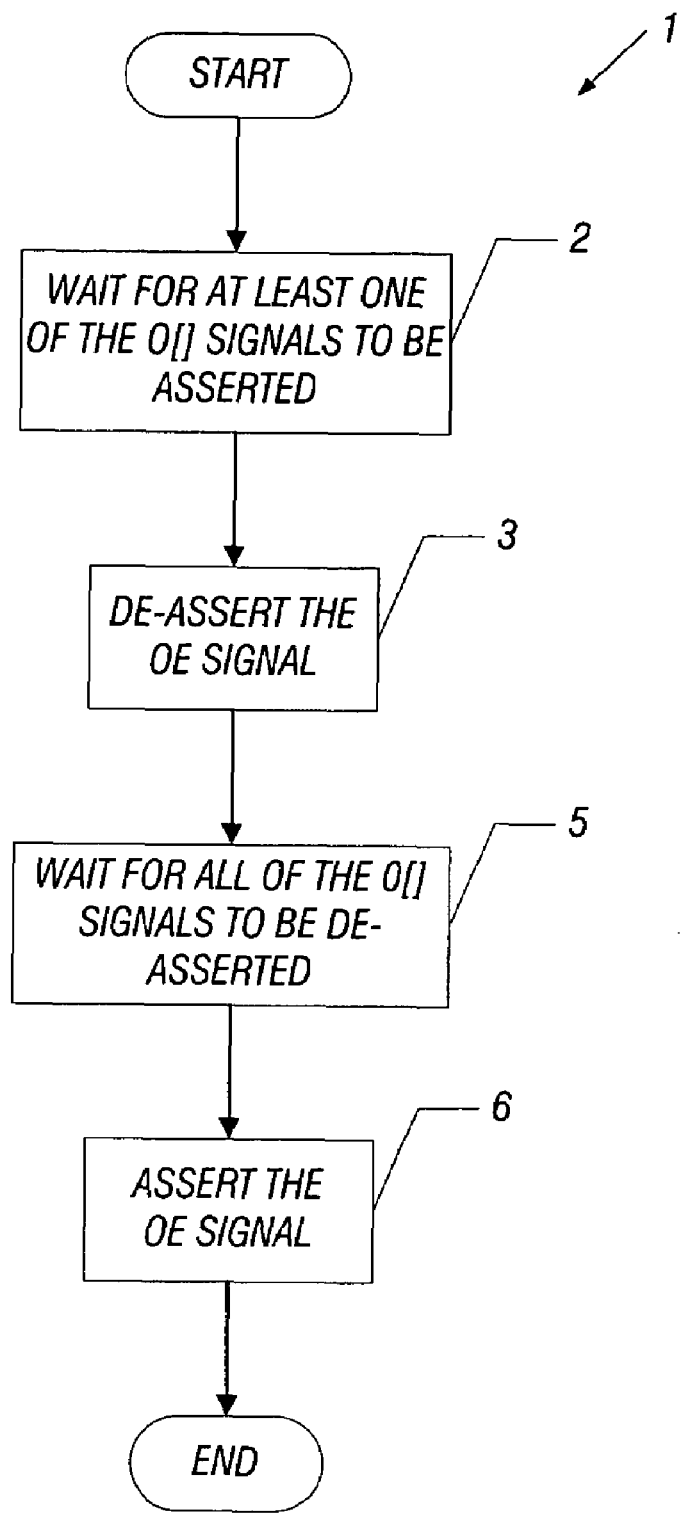
FIG. 1 is flow diagram depicting a quasi delay insensitive protocol according to an embodiment of the invention.

Referring both to FIGS. 1 and 2, in some embodiments of the invention, the transmitter 20 removes an old data value from its output terminals 23 and furnishes a new data value to the output terminals 23 during each oscillation cycle according to a technique 1 (FIG. 1). The technique 1 establishes four state transitions that occur in each cycle: two state transitions (described further below) that ensure stability of both the transmitter 20 and the receiver 40 before the transmitter 20 removes the current output value from the output terminals 23 and two additional state transitions (described further below) that ensure stability of both the transmitter 20 and the receiver 40 before the transmitter 20 furnishes the next output value to the output terminals 23.

More particularly, in accordance with some embodiments of the invention, the technique 1 (FIG. 1) establishes the following sequence during each oscillation cycle. The receiver 40 waits (block 2 (FIG. 1)) for one of the O[ ] output signals to be asserted. This assertion of one of the O[ ] signals is the first state transition, indicating that the transmitter 20 has driven the O[ ] output signals with a new output value. Upon occurrence of this first state transition, the receiver 40 de-asserts (drives low, for example) the OE signal. The de-assertion of the OE signal is the second state transition that indicates acknowledgment of the transmitter's output and temporarily disables the transmitter 20 from driving a new data value. Subsequently, the receiver 40 waits (block 5) for all of the O[ ] signals to be de-asserted. The de-assertion of all of the O[ ] signals is the third state transition that indicates that the transmitter 20 has withdrawn the data value from its output terminals 23. In response the de-assertion of all of the O[ ] signals, the receiver 40 asserts (drives low, for example) the OE signal, as depicted in block 6. The assertion of the OE signal is a fourth state transition that indicates that the receiver 40 is ready to receive another output from the transmitter 20 and thus, enable the transmitter 20 to drive the next value onto its output terminals.

It is noted that the QDI four-phase handshake depicted in FIG. 1 is a handshake for a specific class of self-timed circuits. In general, however, the oscillator does not require a QDI handshake in the various embodiments of the invention.

In other words, FIG. 1 depicts a particular embodiment of a self-timed handshake, and other non-QDI handshakes may be used in other embodiments of the invention.

The transmitter 20 includes features to ensure that the both transmitter 20 and the receiver 40 stabilize before the transmitter 20 either withdraws the current output value from its output terminals 23 or furnishes the next output value to its output terminals 23. To ensure the stability of the receiver 40, in some embodiments of the invention, the transmitter 20 does not change the state of the O[ ] signals until the OE signal is in the proper logical state in accordance with the technique 1. To ensure the stability of the transmitter 20, each oscillation stage 22 changes its output signal when only when the stage 20 is permitted to do so by an internal state bit; and in some embodiments of the invention, the transmitter 20 also includes interlock features (described below) to ensure each oscillator stage 22 does not prematurely assert its O[ ] output signal 23 if the previous stage 22 in the sequence is asserting its O[ ] output signal (in accordance with the 1 by n encoding).

More specifically, in some embodiments of the invention, each oscillation stage 22 includes a latch 24 that stores an indication of a state of the stage 22. The state for each stage 22 indicates whether the stage 22 is either going to assert its associated O[ ] output signal on the next assertion of the OE signal or whether the stage 22 is currently asserting its associated O[ ] output signal.

As depicted in FIG. 2, the status of each bit in the stage 22 may be indicated by a corresponding state signal called S[ ] (state signals S[0], S[1], S[2] . . . S[n-1], depicted as examples). As a more specific example, the stage $22_0$ furnishes a signal called S[0] that indicates the status of the latch 24 of the stage $22_0$. When the stage $22_{n-1}$ asserts the O[n-1] signal, this causes the latch 24 of the stage $22_0$ to set its state bit and thus, assert the corresponding S[0] signal. Therefore, on the receiver's next assertion of the OE signal, the stage $22_0$ asserts the O[0] signal.

As depicted in FIG. 2, in some embodiments of the invention, the latch 24 may include a set terminal 28 that receives the output signal from the previous stage 22 in the sequence; and the latch 24 includes a clear terminal 30 that receives the state signal from the next stage 22 in the sequence. As a more specific example, as shown in FIG. 2, the latch 24 of the stage $22_0$ includes a set terminal 28 that receives the O[n-1] signal from the stage $22_{n-1}$; and the latch 24 includes a clear terminal 30 that receives the state signal S [1] signal from the stage $22_1$. Thus, when the O[n-1] signal, the signal of the previous stage in the sequence, is asserted (driven high, for example) the stage $22_0$ sets its state bit; and when the state bit of the next stage $22_1$ is set, the stage $22_0$ clears its state bit.

In some embodiments of the invention, the transmitter 20 includes interlock features to ensure that the O[ ] signal is not asserted prematurely by a particular stage 22. More specifically, the state bit of the stage 22 may be asserted for purposes of indicating an upcoming assertion of the O[ ] signal for the stage 22. However, for purposes of ensuring that the O[ ] output signal of the stage 22 is not asserted prematurely in response to its assertion of the state bit, the stage 22 includes an input terminal 32 that receives the output signal from the previous stage in the sequence. When this signal applied to the input terminal 32 is asserted, this means that another stage, i.e., the previous stage, is asserting its output signal; the assertion of the signal at the input terminal 32 prevents the stage 22 from asserting its output signal prematurely to preserve the 1 by n encoding.

As a more specific example, assume that the stage $22_{n-1}$ is currently asserting the O[n-1] signal; and assume that the stage $22_0$ has already set its state bit. To prevent the stage $22_0$ from asserting the output signal O[0] signal prematurely, the asserted O[n-1] signal appears at the input terminal 32 of the stage $22_0$ to prevent the stage $22_0$ from prematurely asserting the O[0] signal. After the stage $22_{n-1}$ de-asserts the O[n-1] signal, the stage $22_0$ is permitted to set its stage bit on the next assertion of the OE signal.

Figure 3:
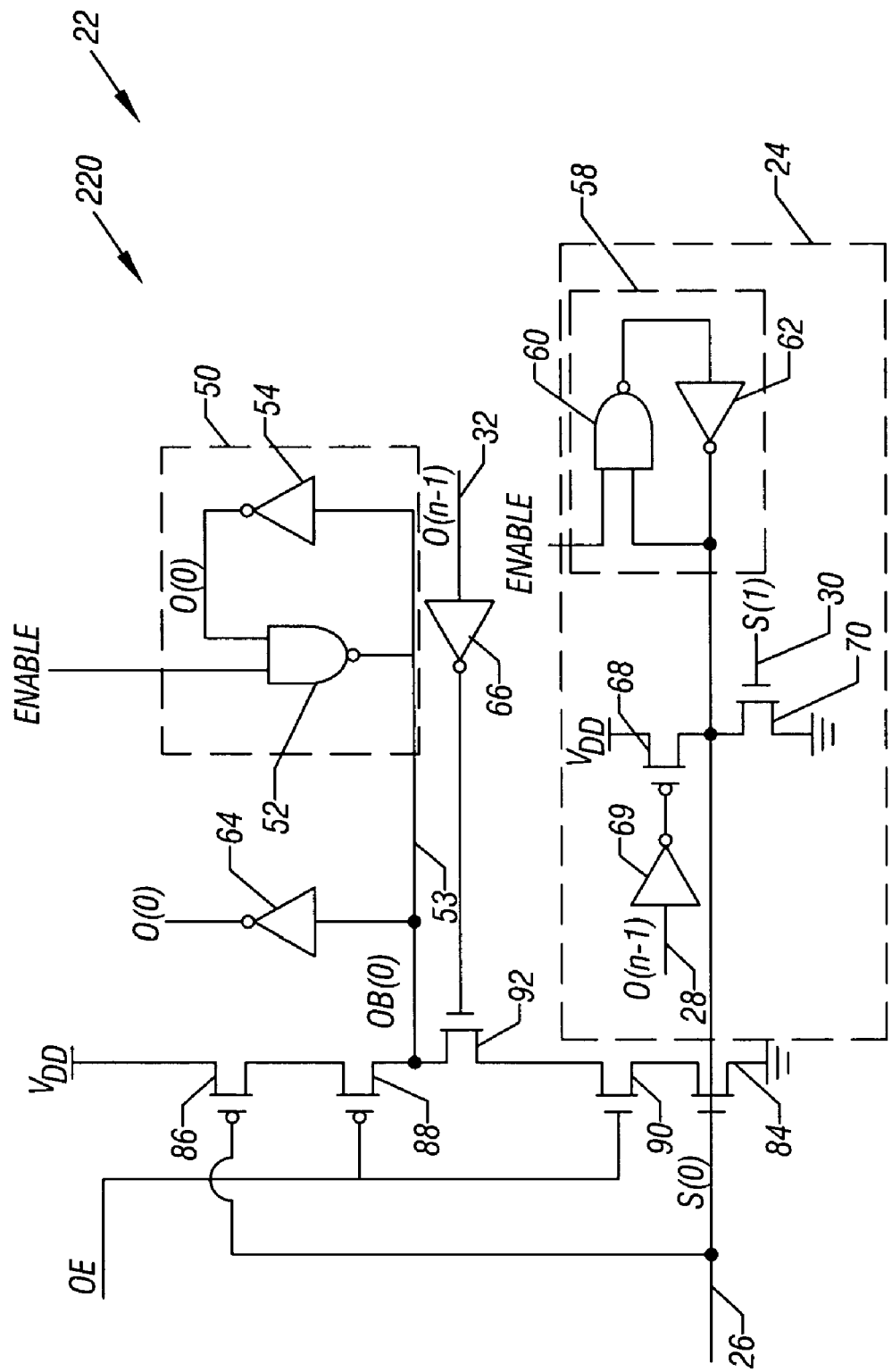
FIG. 3 is a schematic diagram of a stage of the oscillator of FIG. 2 according to an embodiment of the invention.

In some embodiments of the invention, each oscillator stage 22 may have a design similar to the design of the output stage $20_0$, that is depicted in FIG. 3. More specifically, in some embodiments of the invention, the latch 24 may include a latch circuit 58 for purposes of storing the state bit. The latch circuit 58 may include a NAND gate 60 that receives an ENABLE signal at one input terminal of the gate 60. Another input terminal of the NAND gate 60 is connected to a latch output terminal 26 that indicates the state of the bit that is stored by the latch 24. The output terminal of the NAND gate 60 is coupled to an input terminal of an inverter 62. The output terminal of the inverter 62, in turn, is coupled to the output terminal 26. Thus, the back-to-back arrangement of the NAND gate 60 and inverter 62 latches the state bit. The ENABLE signal is asserted (driven high, for example) to, as its name implies, to enable operation of the stage $22_0$ (and thus, disable operation of the transmitter 20) and is deasserted for purposes of disabling operation of the stage 22.

For purposes of setting the state bit, in some embodiments of the invention, the latch 24 includes a p-channel metal oxide semiconductor field-effect-transistor (MOSFET) 68. The drain terminal of the MOSFET 68 is coupled to the latch output terminal 26. The source terminal of the MOSFET 68 is coupled to a supply voltage (called $V_{DD}$), and a gate input of the MOSFET 68 receives the inverted output signal from the previous stage. More specifically, the gate of the MOSFET 68 is logically coupled to the output terminal of an inverter 69, the input terminal of which is coupled to the set terminal 28. Thus, for the stage $23_0$, the gate terminal of the MOSFET 68 receives the O[n-1] signal. Due to this arrangement, when the signal that appears at the set terminal 28 is asserted (driven high, for example) the MOSFET 68 is activated to pull the logical level of the latch output terminal 26 to a logic high level and thus, change the state bit that is stored by the latching circuit 58.

In some embodiments of the invention, the latch 24 also includes an n-channel MOSFET 70 for purposes of clearing the state bit. The drain terminal of the MOSFET 70 is coupled to the latch output terminal 26, and the source terminal of the MOSFET 70 is coupled to ground. The gate terminal of the MOSFET 70 is coupled to the clear terminal 30 and thus, receives the indication of the state bit from the next stage 22 in the sequence. Thus, for the state $22_0$, the clear terminal 30 of the stage $22_0$ receives the S[1] signal from the stage $22_1$. When the signal that appears at the clear terminal 30 is asserted, the MOSFET 70 is activated to clear the state bit.

The oscillation stage 22 also includes a latch 50 to latch and store the value of the O[ ] output signal. More specifically, in some embodiments of the invention, the latch 50 may include a latch output terminal 53 that indicates a signal called OB[ ], which is the inverse of the O[ ] signal. Thus, for the stage 220, the latch output terminal 53 indicates the OB[0] signal.

Regarding the specific structure of the latch 50, in some embodiments of the invention, the latch 50 includes a NAND gate 52 that has one input terminal that receives the ENABLE signal. Another input terminal of the NAND gate 52 is coupled to an output terminal of an inverter 54. The output terminal of the NAND gate 52 is coupled to the latch output terminal 53, and the input terminal of the inverter 54 is also coupled to the output terminal 53. In some embodiments of the invention, an inverter 64 may have an input terminal coupled to the latch output terminal 53 for purposes of furnishing the non-inverted O[ ] output signal. For the stage $22_0$, the inverter 64 furnishes the O[0] signal.

In some embodiments of the invention, the stage 22 includes a logic tree for purposes of changing the output signal of the stage 22 in response to the various signals that are described above. More specifically, in some embodiments of the invention, the stage 22 includes a p-channel MOSFET 86 that has its source terminal coupled to the $V_{DD}$ supply voltage level. The drain terminal of the MOSFET 86, in turn, is coupled to the source terminal of another p-channel MOSFET 88. The drain terminal of the MOSFET 88 is coupled to the latch output terminal 53.

The gate terminal of the MOSFET 86 receives the state signal. For the stage $22_0$, the gate terminal of the MOSFET 86 is coupled to receive the state signal S[0]. The gate terminal of the MOSFET 88 is coupled to receive the OE signal.

Thus, due to the above-described logic arrangement, in response to the S[0] being deasserted (i.e., the state bit being cleared) the MOSFETs 86 and 88 are activated upon the assertion of the OE signal to drive the output latch terminal 53, and thus, clear the O[ ] output signal (O[0] signal for the stage 22.) Otherwise, if the state bit 82 set, the MOSFET 86 is not activated so that the signal stored by the latch 50 is not changed.

For purposes of driving the output signal of the stage 22 high, the stage 22 includes n-channel MOSFETs 92, 90 and 84. The drain terminal of the MOSFET 92 is coupled to the latch output terminal 53, and the source terminal of the MOSFET 92 is coupled to the drain terminal of the MOSFET 90. The source terminal of the MOSFET 90 is coupled to the drain terminal of the MOSFET 84, and the source terminal of the MOSFET 84 is coupled to ground.

The gate terminal of the MOSFET 92 receives the inverted output signal from the previous stage 22 in the sequence. In the example depicted in FIG. 3, the MOSFET 92 of the stage $22_0$ receives the inverted O[n-1] signal. The gate terminal of the MOSFET 90 receives the OE signal, and the gate terminal of the MOSFET 84 receives the state signal of the stage 22. Thus, for the stage 220, the gate terminal receives the S[0] signal.

Therefore, due to the above-described arrangement, the output signal of the stage 22 is asserted only when the MOSFETs 92, 90 and 84 are all activated, i.e., when the signals received at the gate terminals of these MOSFETs are driven high. This means that in order to assert the O[ ] output signal of the stage 22, the output stage of the previous output stage in the sequence must have deasserted its output signal (to activate the interlock MOSFET 92), the OE signal must be asserted (to activate the MOSFET 90) and the state signal must be asserted (to activate the MOSFET 84).

As depicted in FIG. 3, due to the arrangement of the NAND gates and inverters of the latching circuits 50 and 58, the values stored by these circuits are initially "0" upon assertion of the ENABLE signal. Thus, the state bit is at a logic zero level, and the O[ ] output signal of the stage 22 is deasserted (driven low, for example) at the initial enablement of the stage 22. However, for purposes of introducing a perturbation at the onset to ensure that an oscillation occurs, in some embodiments of the invention, the latching circuit 58 of one of the stages 22 may store a state bit of "1" at the onset. For example, in some embodiments of the invention, the latching circuit 58 of the stage $22_{n-1}$ (FIG. 2) (as an example) may have a latching circuit 58 that stores an initial state bit of "1." To accomplish this, the NAND gate 60 and the inverter 62 of the latching circuit 58 are connected differently. More specifically, as an example, in some embodiments of the invention, the latching circuit 58 of the this particular stage may be connected so that the input terminal of the NAND gate 60 that is coupled to the output terminal 62 (as depicted in FIG. 3) is instead coupled to the input terminal of the inverter 62. Furthermore, the output terminal of the NAND gate 60 may be coupled to the input terminal of inverter 62 instead of to the output terminal of the inverter 62, as depicted in FIG. 3. Thus, by changing the connections as described above, the latching circuit 58 may initially store a state value of "1."

Figure 4:
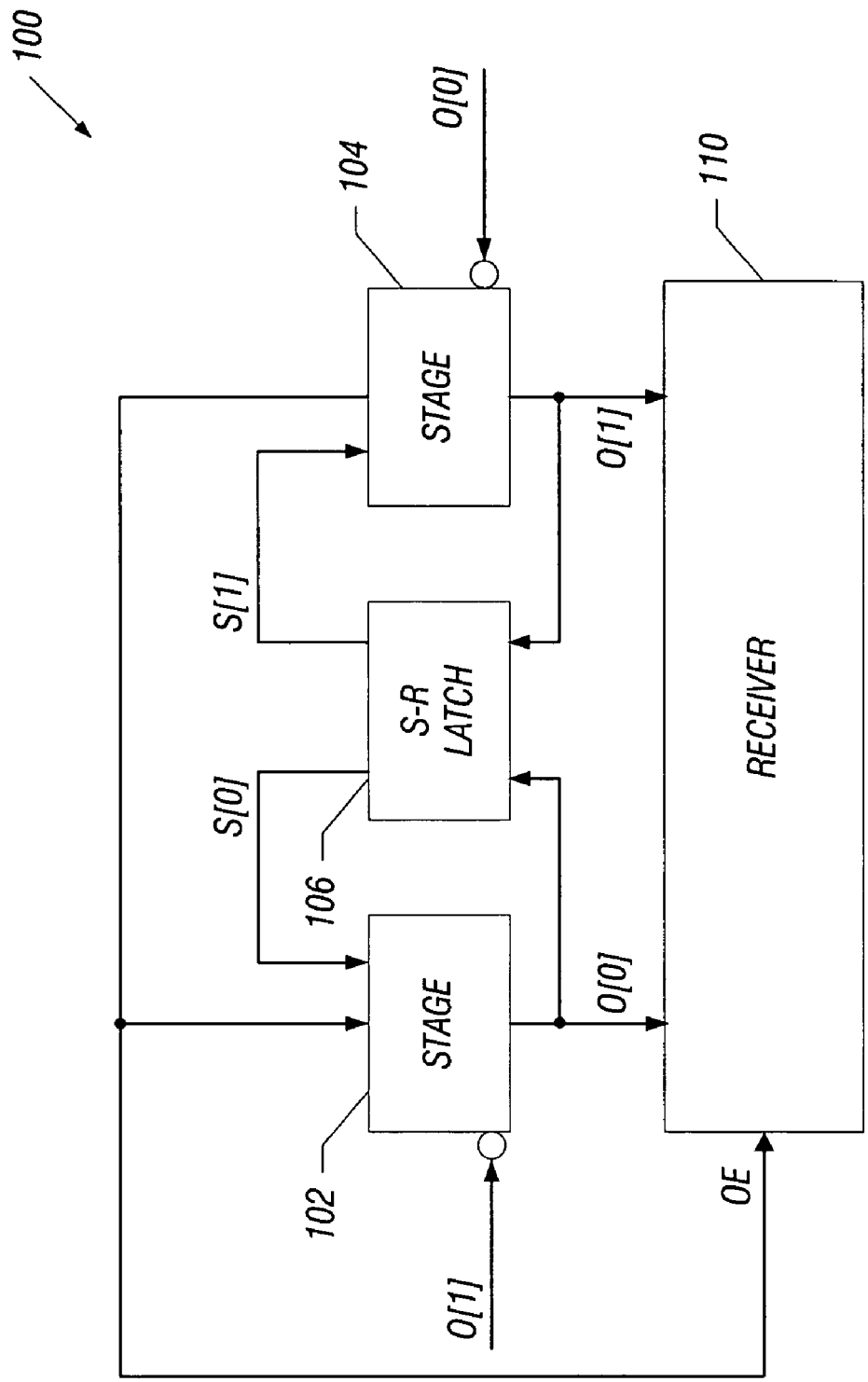

The oscillator 10 that is depicted in FIG. 2 may have 1 to n stages, where "n" has a range of 2 to any desired number. For the case where n equals 2, an oscillator 100 that is depicted in FIG. 4 may be used. The oscillator 100 has a similar design to the oscillator 10, except that two oscillation stages 102 and 104 (replacing the oscillation stages 22) of the oscillator 100 do not include a latch to store the state bit. Instead, for this case in which only two oscillation stages 102 and 104 are present, an external set-reset (S-R) latch 106 may be used and shared by both stages 102 and 104 for purposes of storing the state bits for each of the stages 102 and 104. More specifically, the S-R latch 106 receives the output signals O[0] and O[1] from the stages 102 and 104, respectively. In response to these output signals, the S-R latch 106 generates the state signals S[0] and S[1] for the stages 102 and 104, respectively. Otherwise, the stages 102 and 104 have a similar design to the oscillation stages 22.

Figure 5:
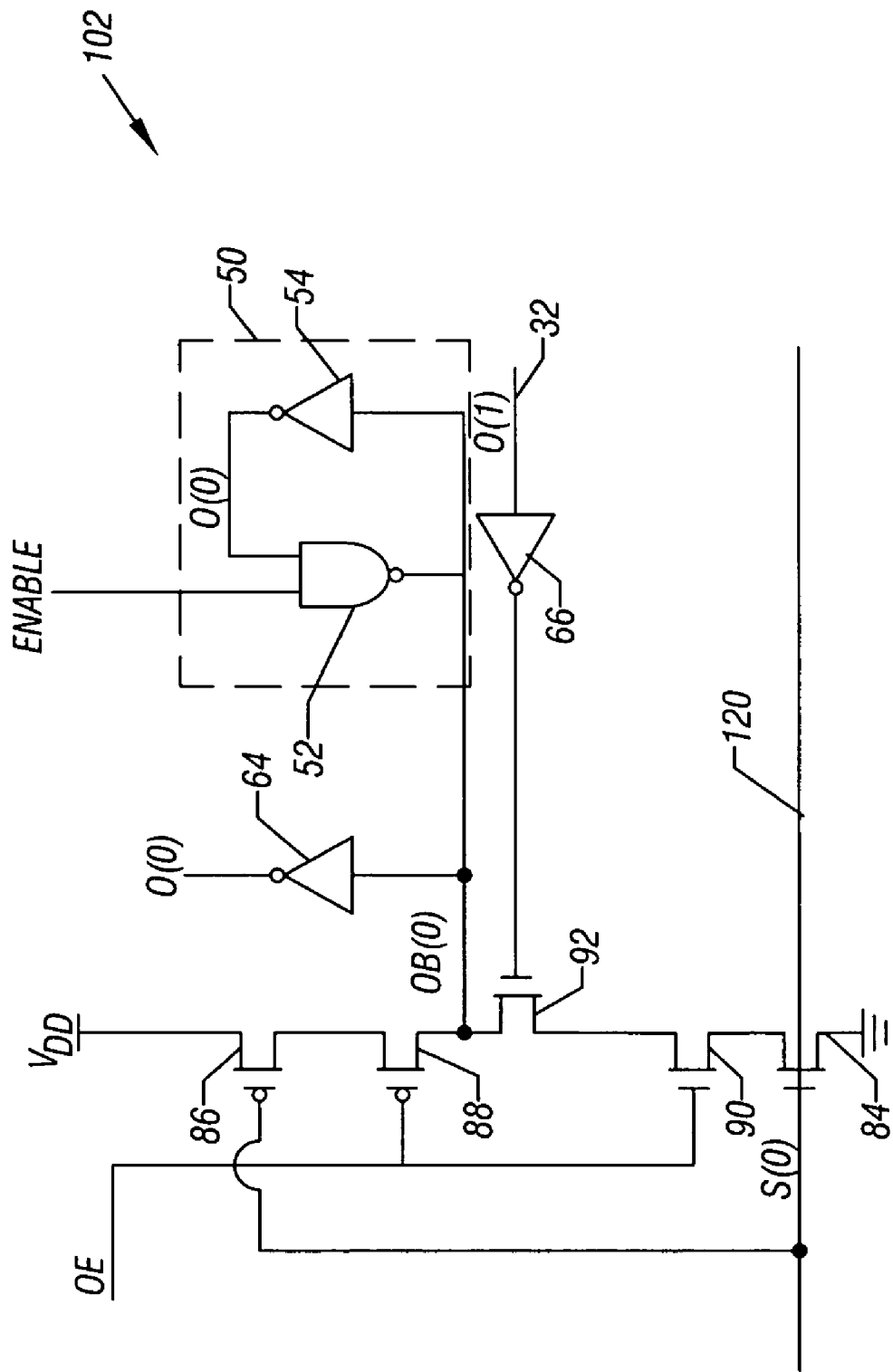
FIG. 5 is a schematic diagram of a stage of the oscillator of FIG. 4 according to an embodiment of the invention.

As a more specific example, FIG. 5 depicts an exemplary design for the stage 102. As shown, the stage 102 has a similar design to the stage 22, except that the latch 24 has been omitted. Furthermore, instead of being connected to a state signal output, the gate of the MOSFET 84 is connected to a terminal 120 that receives the state signal from the S-R latch 106.

Figure 6:
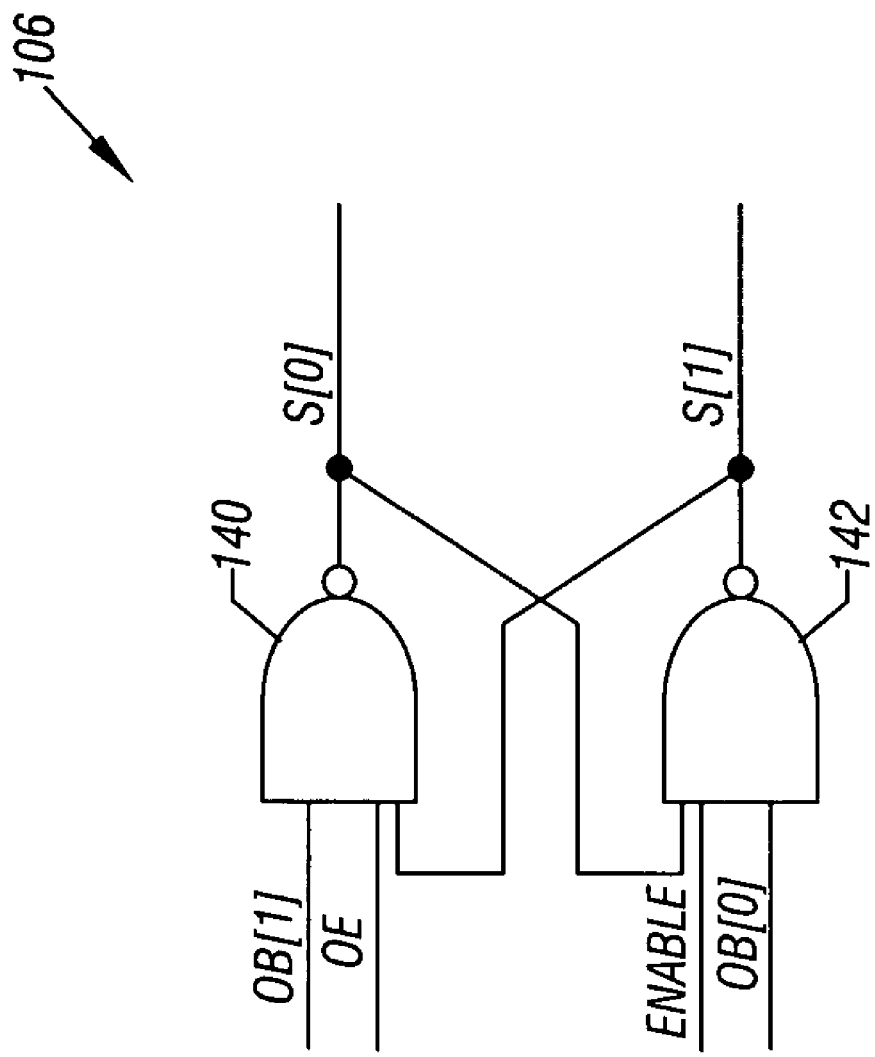
FIG. 6 is a schematic diagram of a latch of the oscillator of FIG. 4 according to an embodiment of the invention.

FIG. 6 depicts an embodiment of the S-R latch 106. In this embodiment of the invention, the S-R latch 106 includes two NAND gates 140 and 142 that generate the state signals S[0] and S[1], respectively. The NAND gate 140 includes an input terminal that receives the OB[1] signal and another input terminal that receives the OE signal. The output terminal of the NAND gate 140 furnishes the S[0] state signal. Another input terminal of the NAND gate 140 is connected to the output terminal of the NAND gate 142. Likewise, an input terminal of the NAND gate 142 is connected to the output terminal of the NAND gate 140. The NAND gate 142 also receives the ENABLE and OB[0] signals at other input terminals.

Figure 7:
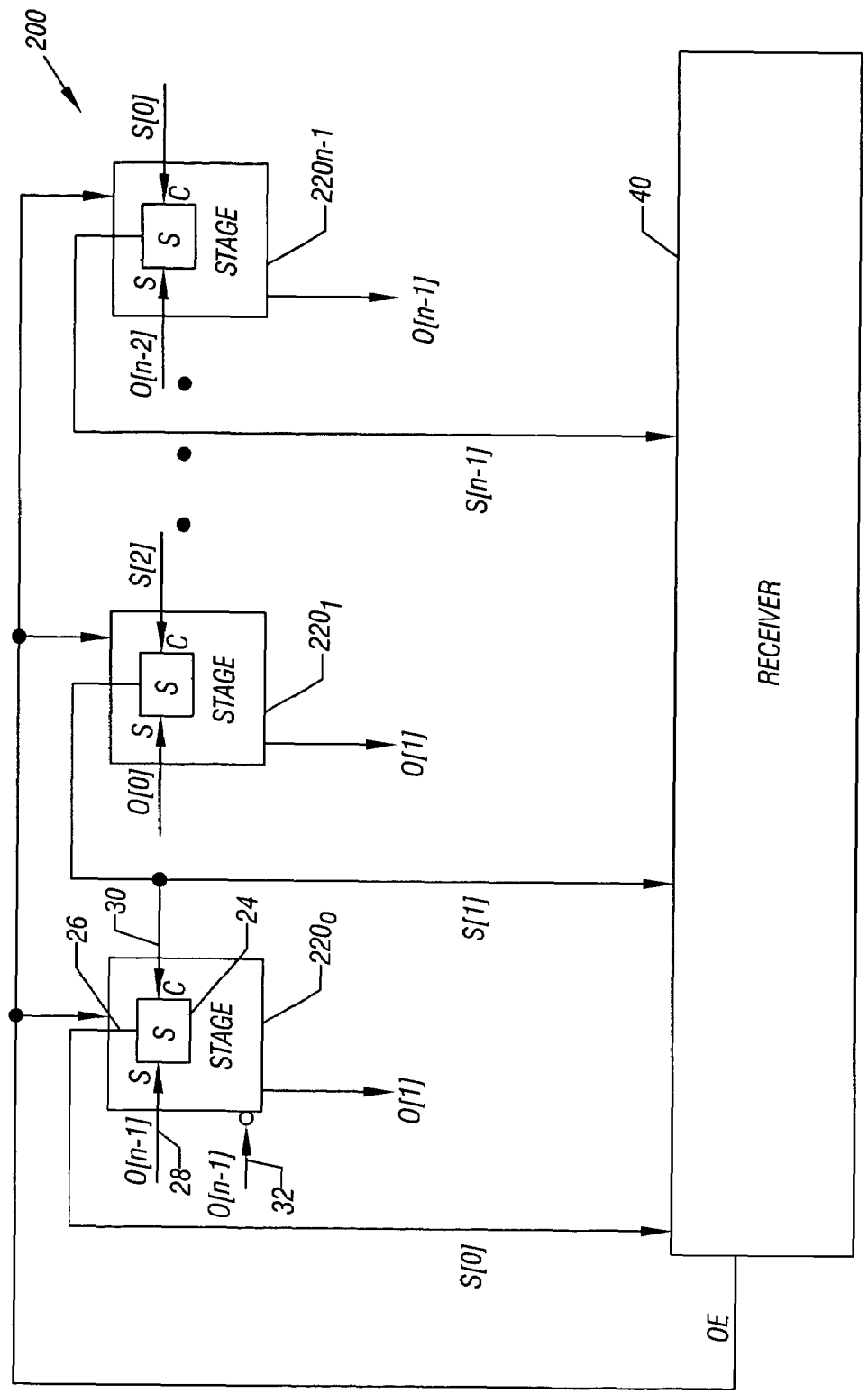
FIGS. 7 and 9 are block diagrams of voltage controlled oscillators according to different embodiments of the invention.

FIG. 7 depicts an embodiment of an n-way voltage-controlled oscillator (VCO) 200 that has a similar design to the oscillator 10 with the following differences. The voltage controlling the oscillation is supplied by the OE signal. As depicted in FIG. 7, the stages 22 of the oscillator 10 are replaced with stages 220 described further below. First, for the oscillator 200, the output signals are not formed from the O[ ] signals, but rather, the output signals are tapped directly from the S[ ] state signals. Thus, the state signals S[0], S[1] . . . S[n-1] form the output signals that are received by the receiver 40. Another difference between the oscillators 20 and 200 is that during each oscillation cycle the oscillator 200 does not wait for the de-assertion of the OE signal to remove the output value from its output terminals.

Figure 8:
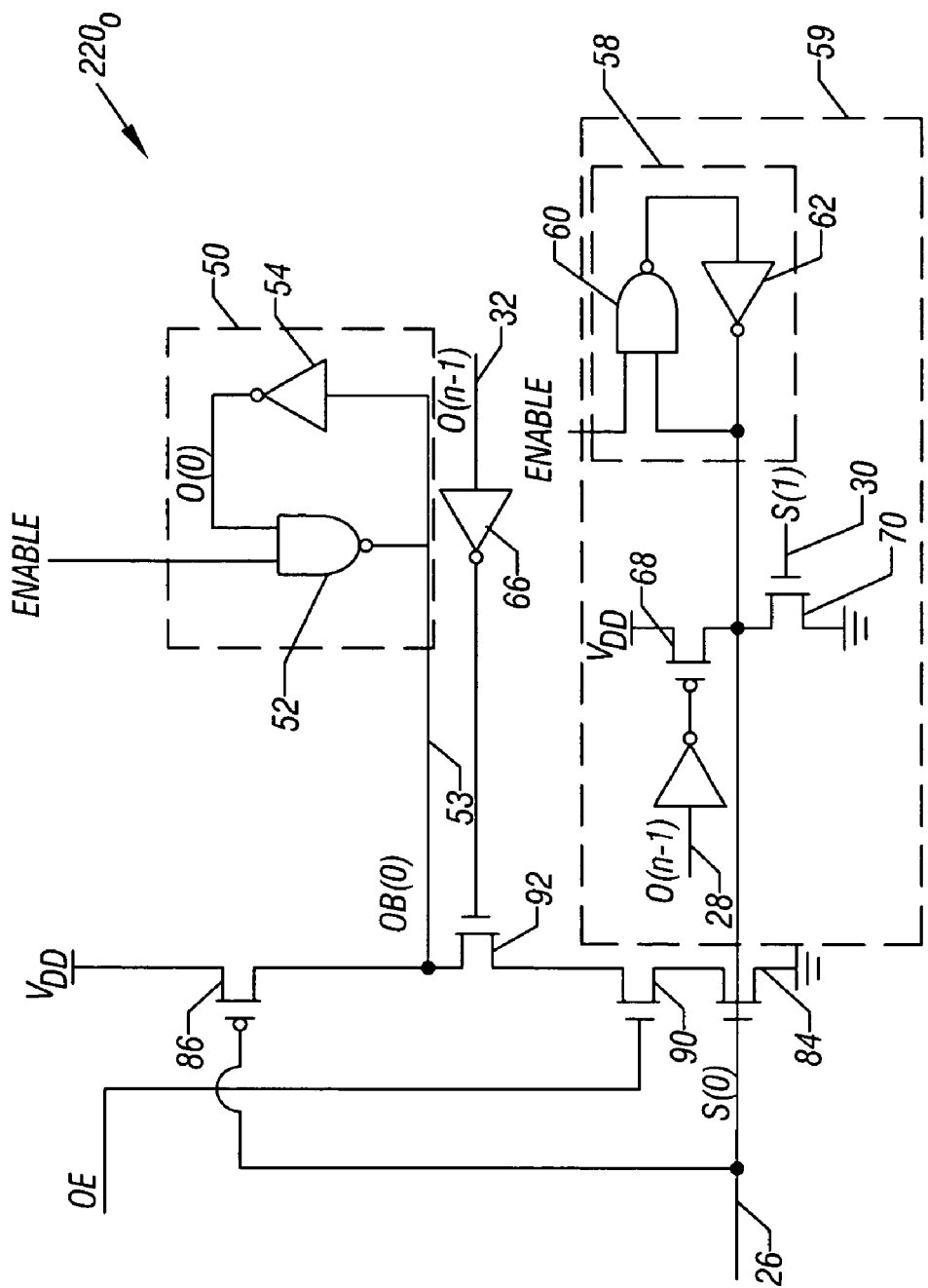
FIG. 8 is a schematic diagram of a stage of the oscillator of FIG. 7 according to an embodiment of the invention.

Each stage 220 has a similar design to the stage 22 except for the following differences. In particular, each stage 220 does not include the MOSFET 88; and thus, the transmitter 20 does not wait for the de-assertion of the OE signal by the receiver 40 before de-asserting the O[ ] output signal. More specifically, FIG. 8 depicts an exemplary embodiment of the stage 220₀, according to a particular embodiment of the invention. Referring to FIG. 8, as shown, the MOSFET 88 is not present in the stage 220, but rather, the drain of the MOSFET 86 is coupled to the drain of the MOSFET 82. Due to this arrangement, the stage 200 does not wait for the receiver 40 to respond to the assertion of the transmitter's output signals before the stage 220 resets its output signals.

The speed of the oscillator 200 depends on the supply voltage, OE gate voltage and body voltage that is applied to the p-channel MOSFETs. In a standard n-well CMOS process, different body voltages may be used to adjust the duty cycle. The maximum speed is achieved when all bulks are at the supply voltage level, and the OE signal switches between the supply voltages.

Figure 9:
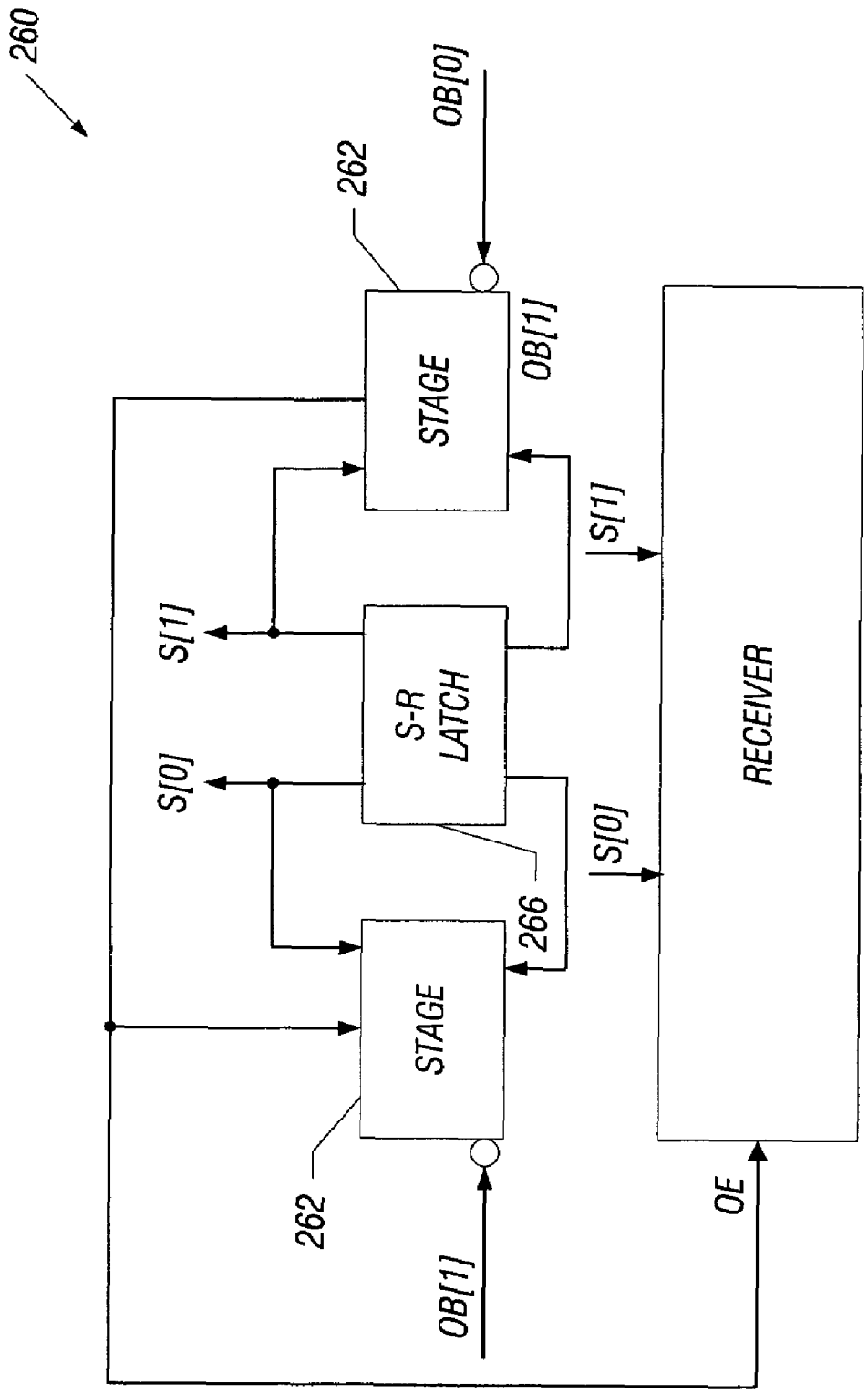
Figure 10:
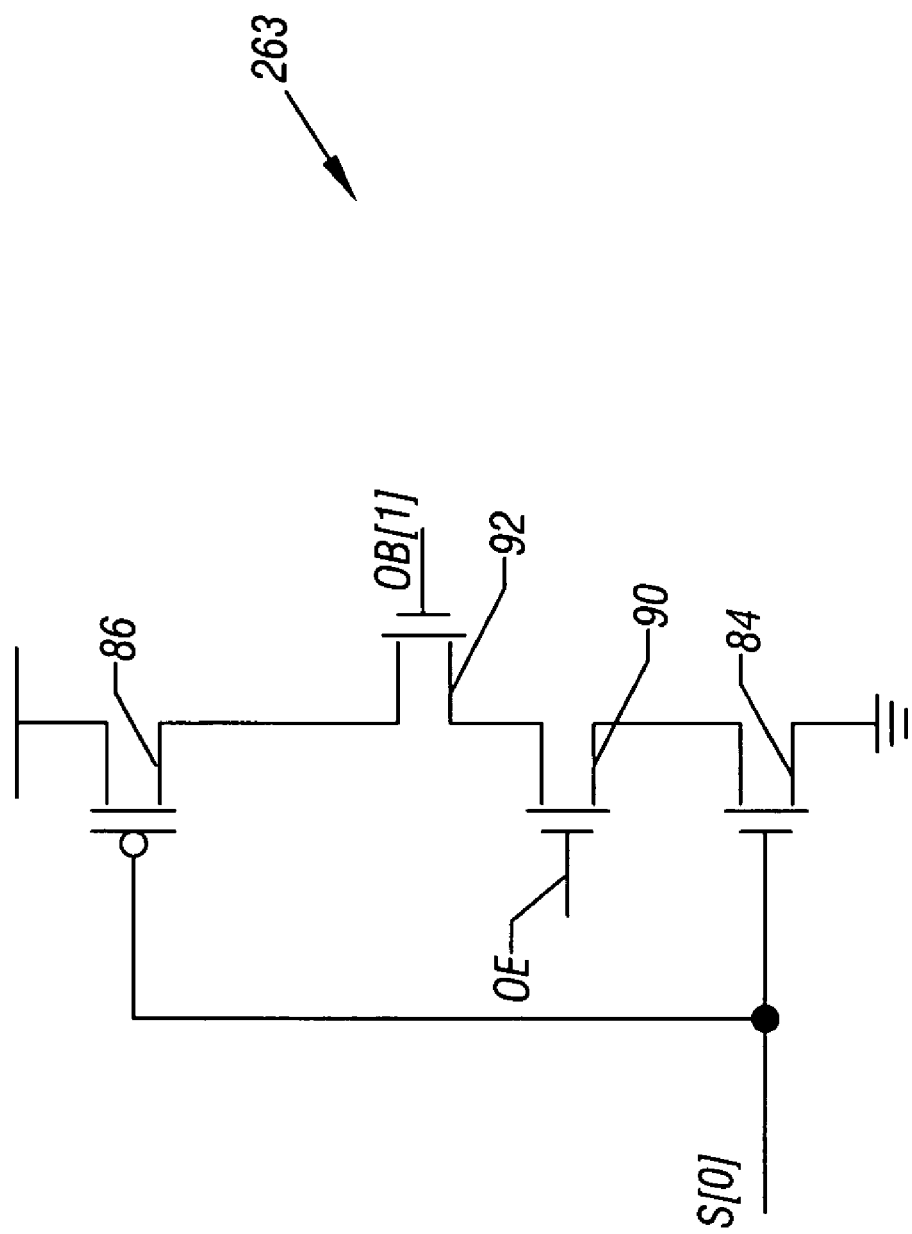
FIGS. 10 and 11 are schematic diagrams of stages of the oscillator of FIG. 9 according to different embodiments of the invention.
Figure 11:
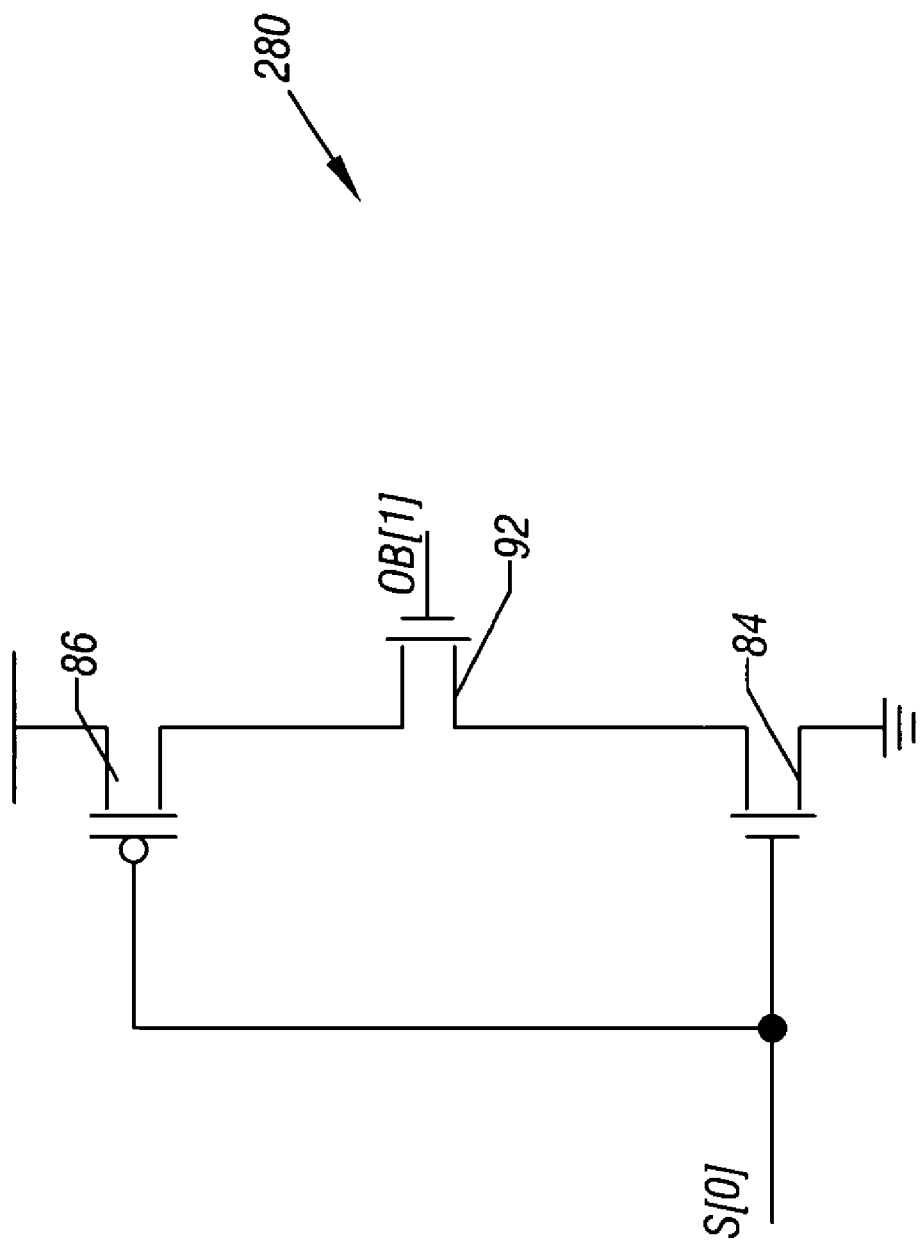

The oscillator 200 is depicted in FIG. 7 for n stages. For the case where n equals 2, the oscillator 200 may be replaced by an oscillator 260 that is depicted in FIG. 9. The oscillator 260 includes two oscillator stages 262 that replace the stages 220. Each stage 220 has a similar design to the stage 262, except that unlike the stage 220, the stage 262 does not include a stage latch. Instead, the stage latch is replaced by an S-R latch 266 that is shared in common between stages 262. Each stage 262 may, in some embodiments of the invention, have a similar design to the oscillator 220 and share the same logic tree 263, as depicted in FIG. 10. However, in other embodiments of the invention, the logic tree 263 may be replaced by a logic tree 280 that is depicted in FIG. 11. The logic tree 280 is similar to the logic tree 263, except that the logic tree 280 omits the MOSFET 90. Thus, due to this arrangement, the oscillator has the maximum possible speed, depending on finite metastability for initialization. At four transitions per cycle and only fourteen transistors, this is one of fastest stable circuits designable in CMOS.

Figure 12:
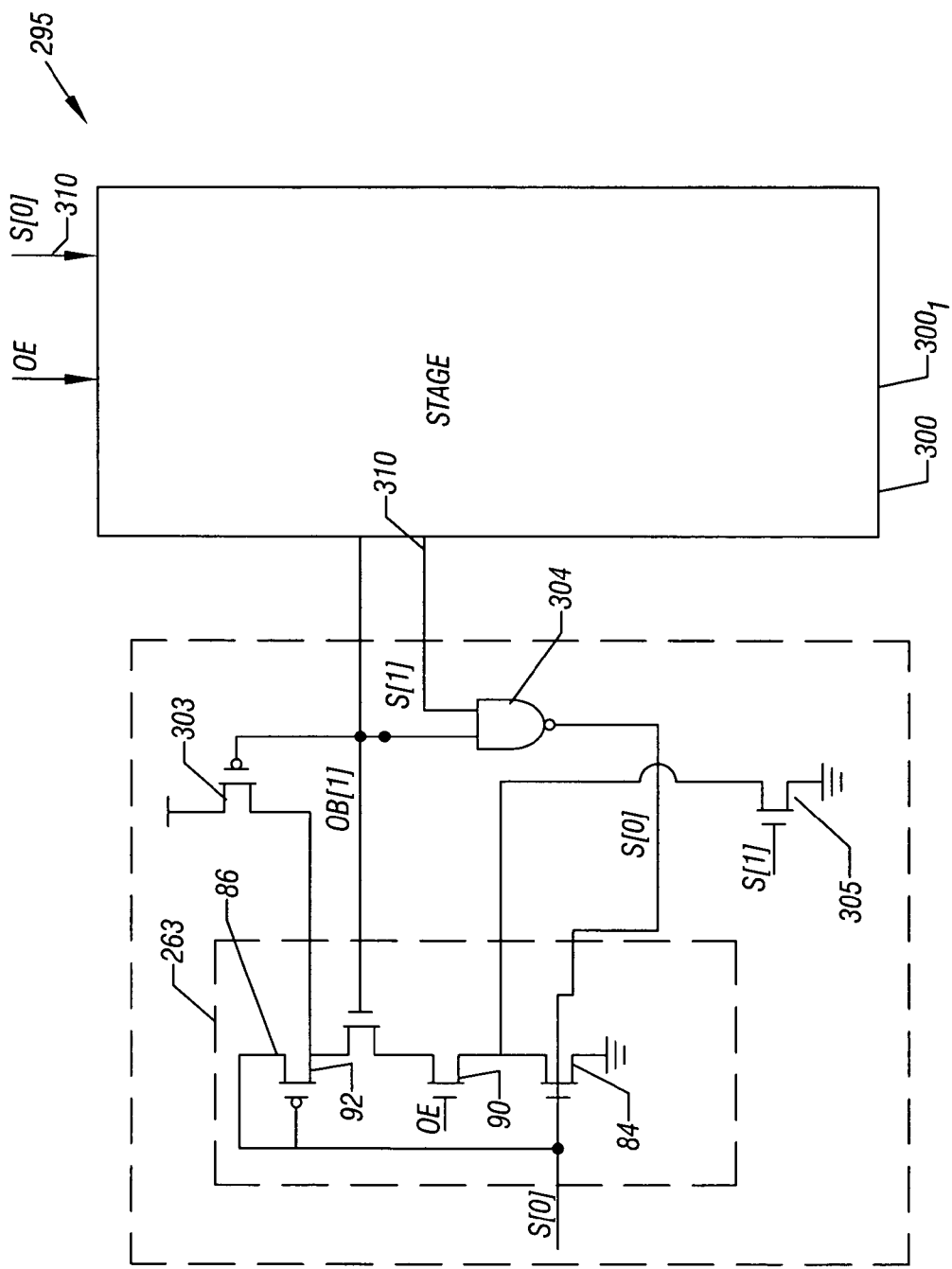
FIG. 12 is a schematic diagram of a staticizer circuit according to an embodiment of the invention.

FIG. 12 depicts an alternative topology 295 that uses weak transistors for purposes of latching the output signal and state signal from each stage. More specifically, the topology 295 includes an exemplary stage 300 that includes the logic tree 262. Instead of latching circuits to latch the state and output signals, the stage 300 includes a weak p-channel MOSFET 303 that has its drain terminal coupled to the drain terminal of the MOSFET 86. The source terminal of the MOSFET 303 is coupled to the $V_{DD}$ supply voltage, and the drain terminal of the MOSFET 303 receives the OB[1] signal. The stage 300 also includes an n-channel MOSFET 305 that has its drain terminal connected to the source terminal of the MOSFET 90. The source terminal of the MOSFET 305 is coupled to ground, and the gate terminal of the MOSFET 305 receives the S[1] signal. Furthermore, as depicted in FIG. 12, the stage 300 includes a NAND gate 304 that has one input terminal that receives an OB[1] signal and another input terminal that receives the S[1] signal. The output terminal of the NAND gate 304 provides the S[0] state signal. Due to this arrangement, the MOSFETs 303 and 305, when activated, set the output state or clear the state bit, respectively. The topology 295 relies on the fact that the OB[ ] are mutually exclusive low, and that the logical condition S[0] OR S[1] always holds. In this topology 295, the MOSFET 305 must be weaker than the MOSFET 84 to prevent erroneous switching of the O[ ] signal.

As further described below, the topology 295 may be used as a divide-by-two frequency divider, with the O[ ] signals being combinable to produce a lower frequency version of the OE signal.

Figure 13:
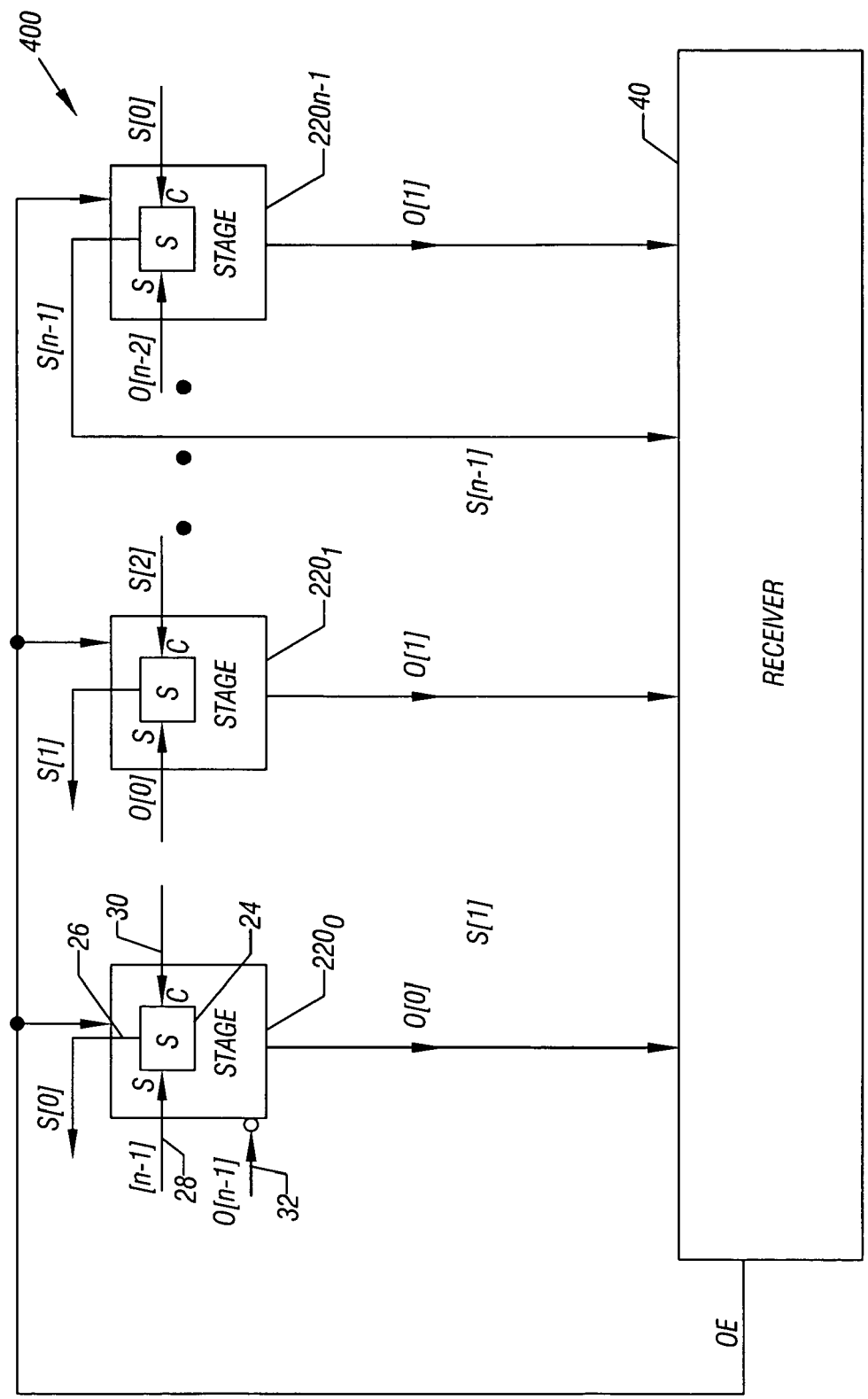
FIG. 13 is a schematic diagram of a frequency divider according to an embodiment of the invention.

FIG. 13 depicts a frequency divider 400 that divides the frequency of the OE signal to produce the O[ ] signals that may be combined to produce a signal having a frequency that is a fraction of the OE signal. The frequency divider 400 has a similar design to the oscillator 200, with the following differences. In particular, the frequency divider 400 includes stages 200. However, unlike the oscillator 200, the output signals O[1], O[2], O[n-1] furnish the output signals to the receiver 40, instead of the state signals S[0], S[1] . . . S[n-1]. The cyclical action of the frequency divider 400 divides the frequency of the OE signal, though duty cycle may not be preserved. This synchronous configuration may potentially malfunction if the input period is less than its internal latency.

Referring to FIG. 14, in some embodiments of the invention, the frequency divider 506 may be used in an application to determine various process parameters. More specifically, in some embodiments of the invention, the topology 295 (FIG. 12) may be used as a prescaler 506 in an integrated circuit, such as a microprocessor 500. In this application, the microprocessor 500 may include a ring oscillator 504 that produces a signal whose frequency may be used to indicate various parameters of the microprocessor 500. For example, the frequency of the signal that is generated by the ring oscillator 504 may indicate various process parameters. The microprocessor 500 includes the prescaler 506 that divides the frequency supply by the ring oscillator 504 to produce a lower frequency signal that is used by an evaluation circuit 507 to extract the process parameters.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. An oscillator comprising:
 a first circuit to asynchronously generate output signals collectively forming an oscillating signal; and
 a second circuit coupled to receive said output signals to generate an enable signal indicating acknowledgement of a transition state of said output signals during an oscillating cycle and temporarily disable said first circuit from changing said output signals to a new state.

2. The oscillator of claim 1, wherein the first circuit transitions the oscillating signal between cycles in response to a signal indicating the first circuit is in a stable state and the enable signal.

3. The oscillator of claim 1, wherein the first circuit comprises multiple output terminals to provide the output signals, and
 the second circuit generates the enable signal in response to all of the output signals indicating the transition state.

4. The oscillator of claim 3, wherein the second circuit de-asserts the enable signal in response to a state of the output signals different from the transition state.

5. The oscillator of claim 1, wherein the first circuit comprises:
 stages, each stage to provide one of the output signals; and
 at least one interlock circuit to prevent at least one of the output signals from transitioning states based on a state of at least one other output signal.

6. The oscillator of claim 5, wherein said at least one interlock circuit ensures only one of the output signals is asserted at one time.

7. The oscillator of claim 5, wherein said at least one interlock circuit comprises at least one of a transistor and an S-R latch.

8. The oscillator of claim 1, wherein the first circuit transitions the oscillating signal between cycles in response to two state changes occurring in the first circuit and two state changes occurring in the second circuit.

9. The oscillator of claim 1, wherein the first circuit asynchronously generates the output signals pursuant to a quasi delay insensitive protocol.

10. The oscillator of claim 1, wherein
 the first circuit waits for assertion of the enable signal to assert at least one of the output signals.

11. The oscillator of claim 10, wherein
 the first circuit does not wait for de-assertion of the enable signal before de-asserting the output signal.

12. A method comprising:
 in a first circuit, asynchronously generating output signals that collectively form an oscillating signal; and
 using a second circuit to receive the output signals and generate an enable signal indicating acknowledgement of a transition state of said output signals during an oscillating cycle and temporarily disable said first circuit from changing said ouput signals to a new state.

13. The method of claim 12, further comprising:
 transitioning the oscillating signal between cycles in response to a signal indicating the first circuit is in a stable state and the enable.

14. The method of claim 12, further comprising:
 transitioning the oscillating signal between states in response to all of the output signals having the same predetermined state.

15. The method of claim 12, further comprising:
 preventing at least one of the output signals from transitioning states based on a state of at least one other output signal.

16. The method of claim 15, wherein the preventing ensures that only one of the output signals is asserted at one time.

17. The method of claim 15, further comprising:
 generating each cycle of the oscillating signal in response to at least four state transitions.

* * * * *